(12) United States Patent
Kubo et al.

(10) Patent No.: US 11,152,564 B2
(45) Date of Patent: Oct. 19, 2021

(54) SUBSTRATE MANUFACTURING METHOD AND PROCESSING SYSTEM

(71) Applicant: Tokyo Electron Limited, Tokyo (JP)

(72) Inventors: Takuya Kubo, Tokyo (JP); Song yun Kang, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/867,826

(22) Filed: May 6, 2020

(65) Prior Publication Data

US 2020/0373480 A1 Nov. 26, 2020

(30) Foreign Application Priority Data

May 20, 2019 (JP) .............................. JP2019-094377

(51) Int. Cl.
*H01L 43/12* (2006.01)
(52) U.S. Cl.
CPC ................................... *H01L 43/12* (2013.01)
(58) Field of Classification Search
CPC ...................................................... H01L 43/12
See application file for complete search history.

(56) References Cited

U.S. PATENT DOCUMENTS

2016/0308112 A1 * 10/2016 Tan ........................... C23F 1/12

FOREIGN PATENT DOCUMENTS

| JP | 2011504301 A | 2/2011 |
| WO | 2009067594 A1 | 5/2009 |

* cited by examiner

*Primary Examiner* — Mounir S Amer
(74) *Attorney, Agent, or Firm* — Studebaker & Brackett PC

(57) ABSTRACT

The first film forming device is configured to form a film using plasma in a consistent vacuum state. In the forming of the first substrate product, the first substrate product is formed in a consistent vacuum state. The first substrate product has the support base, a first lamination region, and a metal region. The first lamination region is provided on the support base. The metal region is provided on the first lamination region, and has a first metal layer and a second metal layer. The first metal layer is provided on the first lamination region, and the second metal layer is provided on the first metal layer. A material of the first metal layer has TiN or Ta, and a material of the second metal layer has TaN or Ru.

4 Claims, 5 Drawing Sheets

SUBSTRATE MANUFACTURING METHOD AND PROCESSING SYSTEM

CROSS-REFERENCE TO RELATED APPLICATIONS

This application is based on and claims the benefit of priority from Japanese Patent Application No. 2019-094377 filed on May 20, 2019 with the Japan Patent Office, the entire contents of which are incorporated herein by reference.

TECHNICAL FIELD

Exemplary embodiments of the present disclosure relate to a substrate manufacturing method and a processing system.

BACKGROUND

Various methods for forming a semiconductor device having a magnetic tunnel junction (MTJ: Magnetoresistive Tunnel Junction) have been developed. Patent Literature 1 (Japanese Unexamined Patent Publication No. 2011-504301) discloses a method for forming a magnetic tunnel junction structure having a conductive layer on a substrate. In this method, a sacrificial layer is deposited on the conductive layer before deposition of a patterned film layer.

SUMMARY

In one exemplary embodiment, a substrate manufacturing method is provided. The substrate manufacturing method includes preparing a support base in a first film forming device; and forming a first substrate product having the support base using the first film forming device. The first film forming device is configured to form a film using plasma in a consistent vacuum state without exposure to an atmosphere. In the forming of the first substrate product, the first substrate product is formed in a consistent vacuum state. The first substrate product has the support base, a first lamination region, and a metal region. The first lamination region is provided on the support base. The metal region is provided on the first lamination region, and has a first metal layer and a second metal layer. The first metal layer is provided on the first lamination region. The second metal layer is provided on the first metal layer. A material of the first metal layer has TiN or Ta. A material of the second metal layer has TaN or Ru.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
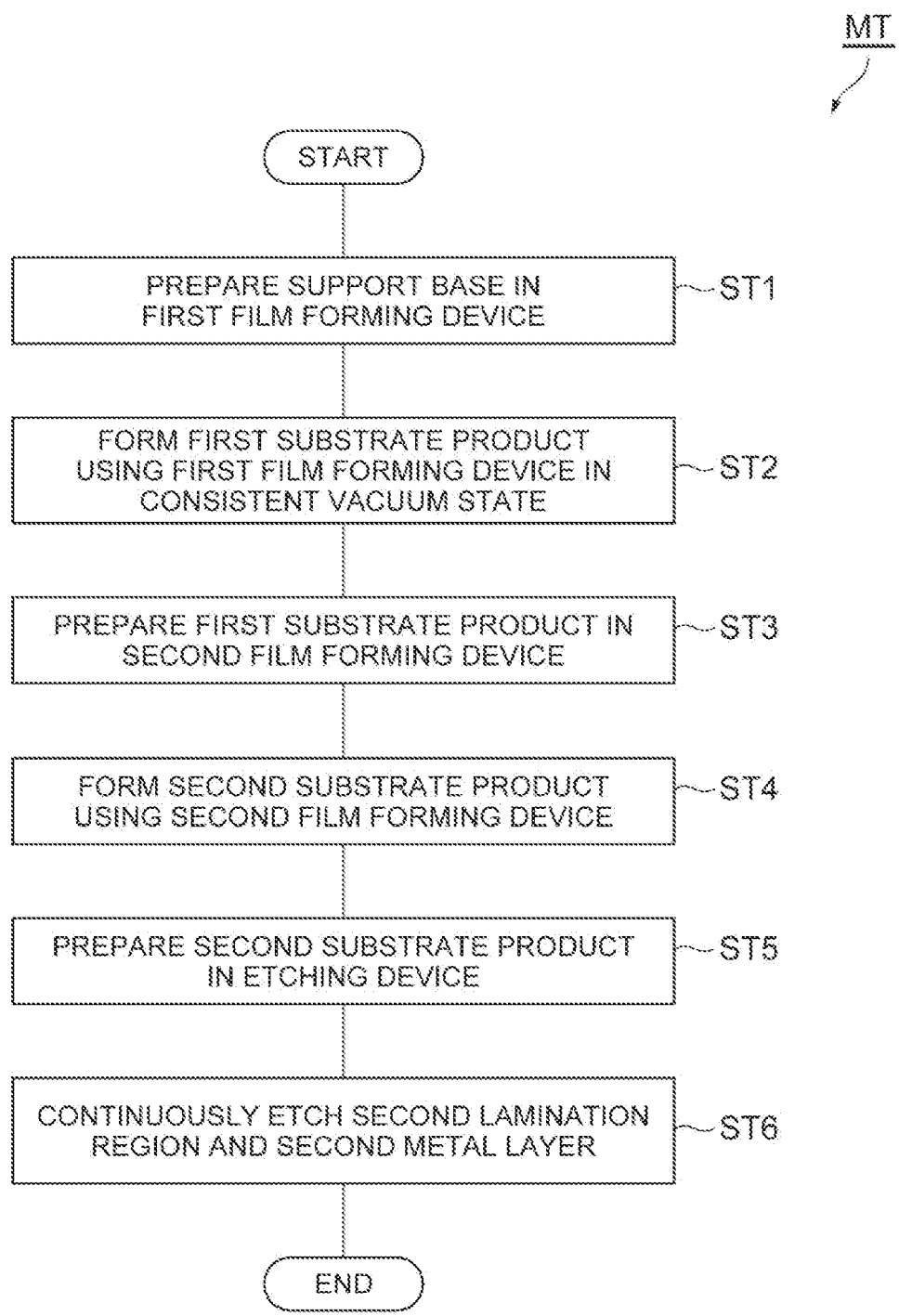
FIG. 1 is a diagram showing an example of a configuration of a substrate manufacturing method according to one exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

A semiconductor device having a magnetic tunnel junction may be provided with a TiN electrode or a Ta electrode. The present disclosure provides a technology for reducing the influence of oxidation of TiN or Ta in the formation of a multilayer film including a TiN electrode or a Ta electrode.

Hereinafter, various exemplary embodiments will be described. In one exemplary embodiment, a substrate manufacturing method is provided. The substrate manufacturing method includes preparing a support base in a first film forming device, and forming a first substrate product having the support base using the first film for forming device. The first film forming device is configured to form a film using plasma in a consistent vacuum state without exposure to the atmosphere. In the forming of a first substrate product, a first substrate product is formed in a consistent vacuum state. The first substrate product has a support base, a first lamination region, and a metal region. The first lamination region is provided on the support base. The metal region is provided on the first lamination region and has a first metal layer and a second metal layer. The first metal layer is provided on the first lamination region. The second metal layer is provided on the first metal layer. The material of the first metal layer includes TiN or Ta. The material of the second metal layer includes TaN or Ru.

After the first lamination region and the metal region are formed, the substrate product may be removed from the first film forming device, and exposed to the atmosphere (particularly, oxygen). However, according to the substrate manufacturing method according to one exemplary embodiment, the first lamination region and the metal region can be formed in the first film forming device in a consistent vacuum environment. The first metal layer of TiN or Ta contained in the metal region is covered by the second metal layer of TaN or Ru contained in the metal region. Accordingly, the influence of oxygen on the first metal layer of TiN or Ta is reduced, and the formation of an oxide in the first metal layer can be suppressed.

The substrate manufacturing method according to one exemplary embodiment further includes preparing the first substrate product in a second film forming device, and forming a second substrate product having the first substrate product using the second film forming device. The second film forming device is configured to form a film using plasma. The second substrate product has a first substrate product and a second lamination region. The second lamination region is provided on the second metal layer of the first substrate product and has a silicon nitride layer. The silicon nitride layer is provided on the second metal layer. After the first metal layer of TiN or Ta and the second metal layer of TaN or Ru are formed, the influence of oxygen on the first metal layer of TiN or Ta can be can be avoided by a second metal layer of TaN or Ru even in a case where a film is further formed on the second metal layer.

The substrate manufacturing method according to one exemplary embodiment further includes preparing the second substrate product in an etching device, and continuously etching the second lamination region and the second metal layer using the etching device. The etching device is configured to perform etching using plasma. Since the second lamination region and the second metal layer can be continuously etched, etching can be relatively easily performed.

In the substrate manufacturing method according to one exemplary embodiment, the first lamination region may have a magnetic tunnel junction region.

In one exemplary embodiment, a processing system is provided. The processing system includes a film forming device and a control device configured to control an operation of the film forming device. The film forming device is configured to form a film using plasma in a consistent vacuum state without exposure to the atmosphere. The control device controls the film forming device to form, in a consistent vacuum state after preparation of the support base in the film forming device, the first lamination region on the support base, form the first metal layer of TiN or Ta on the first lamination region, and form the second metal layer of TaN or Ru on the first metal layer.

After the first lamination region and the metal region are formed, the substrate product may be removed from the first film forming device, and exposed to the atmosphere (particularly, oxygen). However, according to the processing system according to one exemplary embodiment, the first lamination region and the metal region can be formed in a consistent vacuum environment in the first film forming device. The first metal layer of TiN or Ta contained in the metal region is covered by the second metal layer of TaN or Ru contained in the metal region. Accordingly, the influence of oxygen on the first metal layer of TiN or Ta is reduced, and the formation of an oxide in the first metal layer can be suppressed.

According to the present disclosure, it is possible to provide a technology for reducing the influence of oxidation of TiN or Ta in the formation of a multilayer film including a TiN electrode or a Ta electrode.

Figure 2:
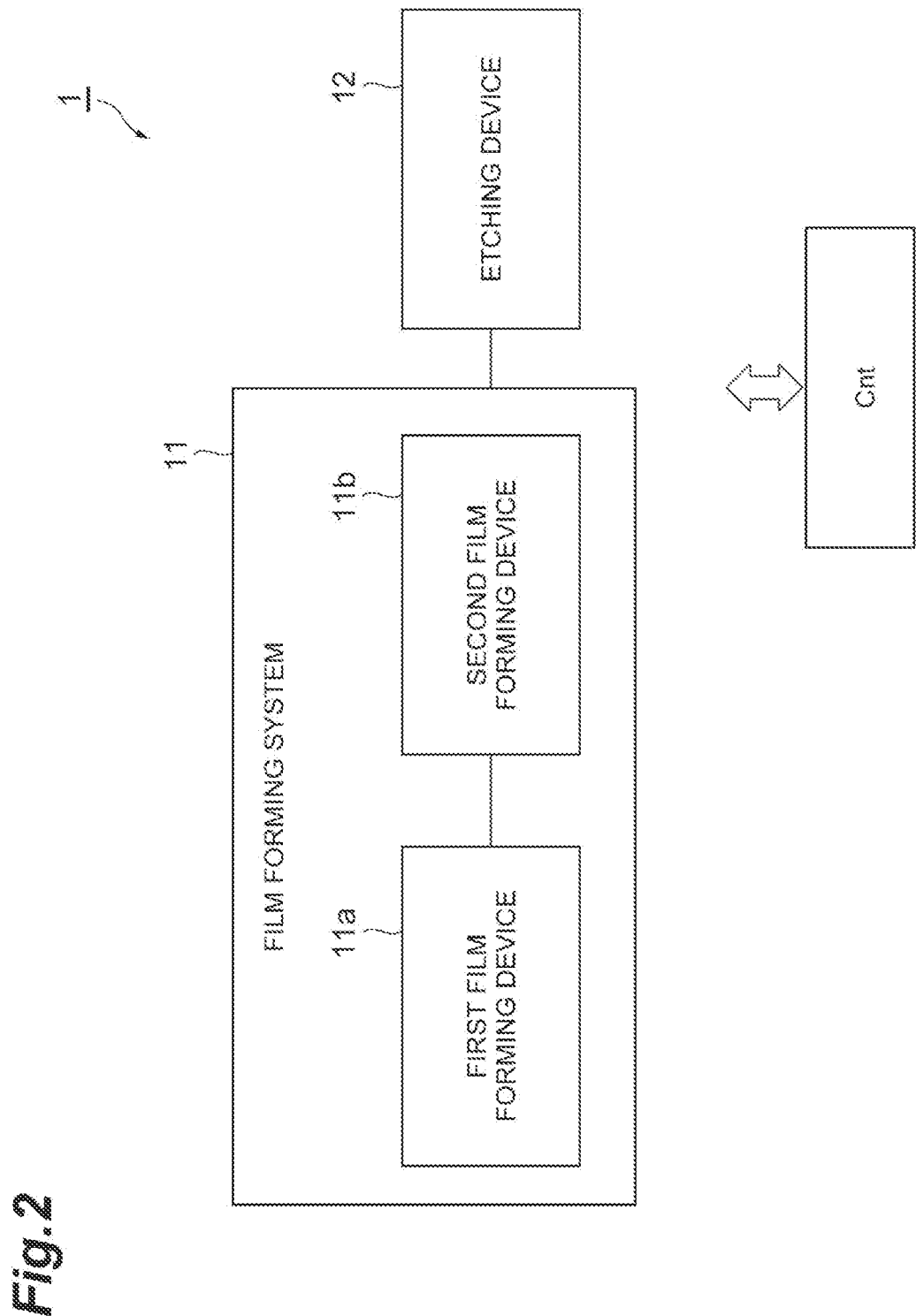
FIG. 2 is a diagram showing an example of a processing system capable of executing the substrate manufacturing method shown in FIG. 1.

Hereinafter, various exemplary embodiments will be described in detail with reference to the drawings. In the drawings, the same or corresponding portions are denoted by the same references. A method MT shown in FIG. 1 is one exemplary embodiment of the substrate manufacturing method using plasma. The method MT can be executed by a processing system 1 shown in FIG. 2.

The processing system 1 can be used for executing the method MT shown in FIG. 1. The processing system 1 is one exemplary embodiment of a processing system which processes the substrate product using plasma. The processing system 1 includes a film forming system 11, an etching device 12, and a control device Cnt.

The film forming system 11 includes a first film forming device 11a and a second film forming device 11b. Each of the first film forming device 11a and the second film forming device 11b has a configuration for forming a film using plasma.

The processing system 1 is configured to move a substrate product between the film forming system 11 and the etching device 12. The film forming system 11 is configured to move a substrate product between the first film forming device 11a and the second film forming device 11b.

The first film forming device 11a is configured to form a film using plasma in a consistent vacuum state without exposure to the atmosphere (oxygen). More specifically, the first film forming device 11a is configured to include a plurality of processing modules, a load lock module, and the like, and to form a plurality of layers (for example, a first lamination region RA and a metal region RB shown in FIG. 4) of different materials.

The second film forming device 11b is configured to form a film using plasma. More specifically, the second film forming device 11b is configured to include a plurality of processing modules, a load lock module, and the like, and to form a plurality of layers (for example, a second lamination region RC shown in FIG. 4) of different materials.

The etching device 12 is configured to perform etching using plasma.

The control device Cnt is configured to perform overall control of the processing system 1. More specifically, the control device Cnt is configured to control operations of the first film forming device 11a, the second film forming device 11b, and the etching device 12. The control device Cnt includes a CPU, a ROM, a RAM, and the like, and controls the processing system 1 by causing the CPU to execute a computer program stored in the memory such as the ROM.

For example, the control device Cnt can execute the method MT shown in the flowchart of FIG. 1 by controlling the processing system 1. The method MT has steps ST1 to ST6 as shown in FIG. 1.

First, the control device Cnt prepares a support base SW in the first film forming device 11a (step ST1). After the support base SW is prepared in the first film forming device 11a (after the step ST1), the control device Cnt controls the first film forming device 11a to execute the step ST2. The step ST2 is a step of forming a substrate product W1 having the support base SW using the first film forming device 11a in a consistent vacuum state without exposure to the atmosphere (oxygen).

Figure 3:
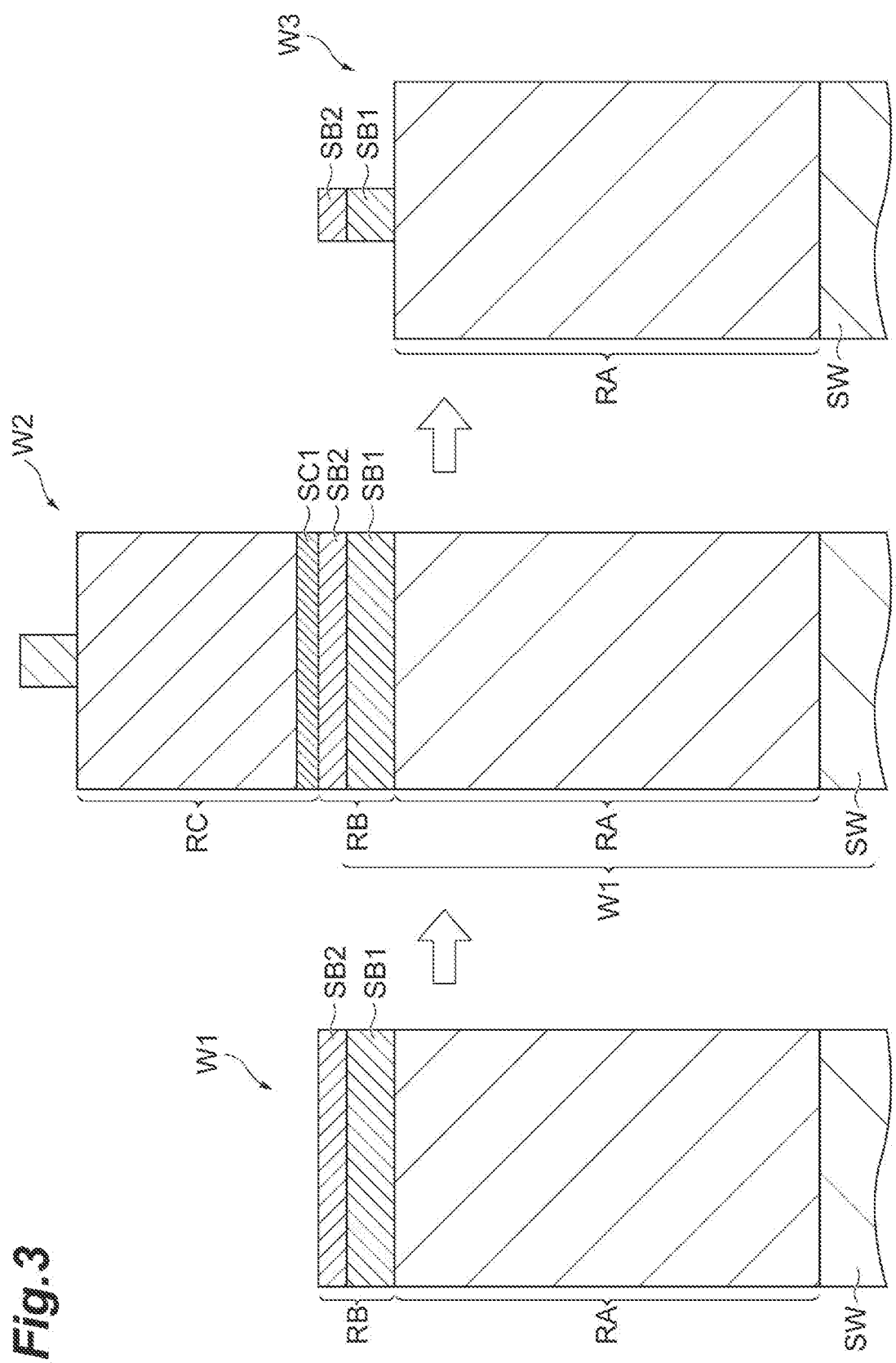
FIG. 3 is a diagram showing exemplary changes of a substrate product obtained by executing the substrate manufacturing method shown in FIG. 1.

As shown in FIG. 3, the substrate product W1 has the support base SW, a first lamination region RA, and a metal region RB. The first lamination region RA is provided on the support base SW. The first lamination region RA is in contact with the support base SW.

The metal region RB is provided on the first lamination region RA, and has a first metal layer SB1 and a second metal layer SB2. The first metal layer SB1 is provided on the first lamination region RA. The first metal layer SB1 is in contact with the first lamination region RA. The second metal layer SB2 is provided on the first metal layer SB1. The second metal layer SB2 is in contact with the first metal layer SB1. The metal region RB can be used as an electrode.

The material of the first metal layer SB1 may have TiN or Ta. The material of the second metal layer SB2 may have TaN or Ru.

In the step ST2, the first lamination region RA and the metal region RB can be formed by a magnetron sputtering method.

In the step ST2, the control device Cnt controls the first film fainting device 11a to form the first lamination region RA on the support base SW, form the first metal layer SB1 on the first lamination region RA, and form the second metal layer SB2 on the first metal layer SB1.

After the first lamination region RA and the metal region RB are formed, the substrate product W1 may be removed from the first film forming device 11a, and exposed to the atmosphere (particularly, oxygen). In a case where the first metal layer SB1 of TiN or Ta is exposed to oxygen, oxygen may enter the first metal layer SB1, a part of the first metal layer SB1 may be oxidized, and an oxide may be formed in the first metal layer SB1. Due to the oxide formed in the first metal layer SB1, the first metal layer SB1 may be relatively significantly changed with time. Furthermore, in the etching of the first metal layer SB1 (for example, in the step ST6 to be described later), a residue due to the oxide formed in the first metal layer SB1 may be formed on the first lamination region RA.

According to the step ST2 of the method MT, the first lamination region RA and the metal region RB can be formed in a consistent vacuum environment without exposure to the atmosphere (oxygen) in the first film forming device 11a. Furthermore, according to the step ST2 of the method MT, the first metal layer SB1 of TiN or Ta contained in the metal region RB is covered by the second metal layer SB2 of TaN or Ru contained in the metal region RB. Accordingly, by providing the second metal layer SB2 of TaN or Ru on the first metal layer SB1 of TiN or Ta, the influence of oxygen on the first metal layer SB1 of TiN or Ta is reduced, and the formation of an oxide can be suppressed in the first metal layer SB1. For example, a change of the first metal layer SB1 with time is reduced, and a residue which may be formed on the first lamination region RA after etching can be reduced in the etching of the first metal layer SB1 (for example, in the step ST6 to be described later).

Figure 4:
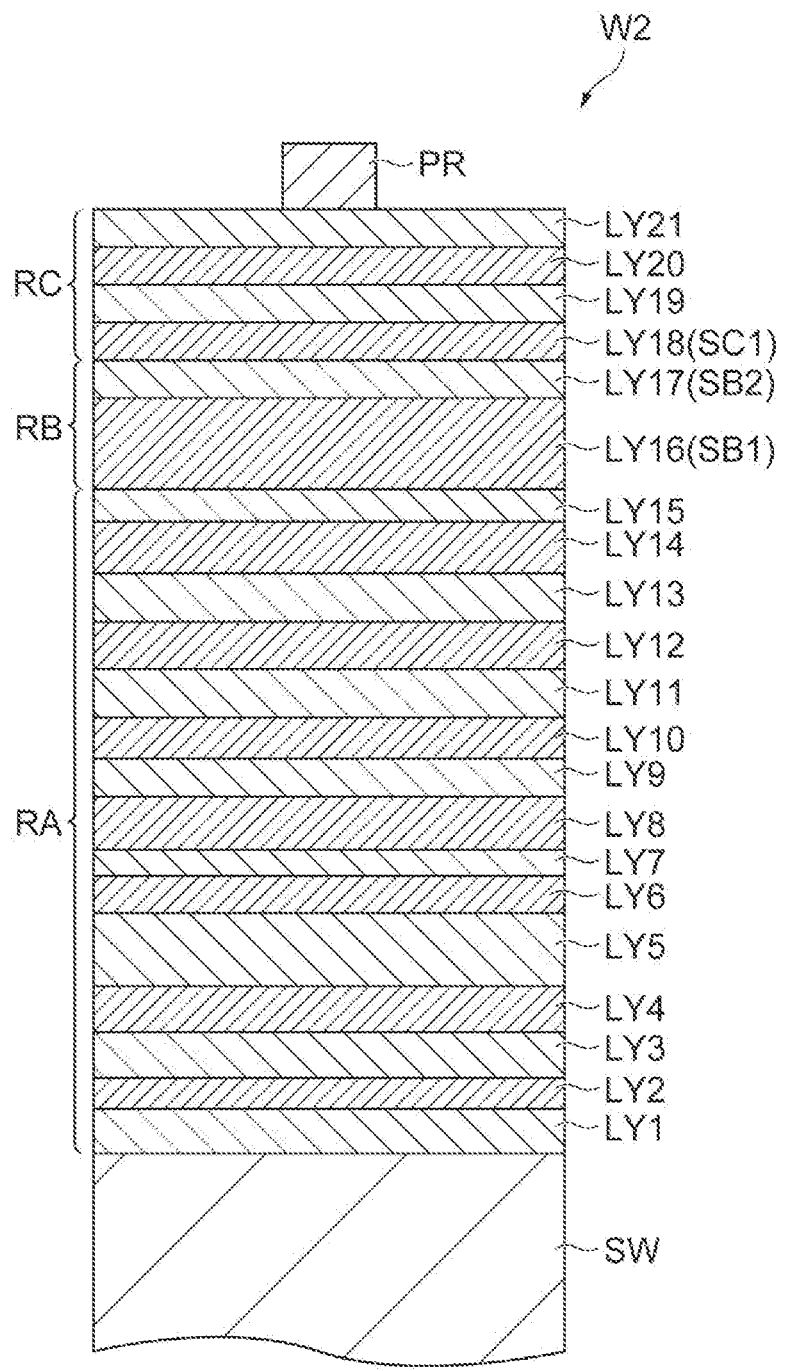
FIG. 4 is a diagram showing an example of a lamination structure of the substrate product shown in FIG. 3.

An atomic ratio of oxygen in the first metal layer SB1 of TiN was measured by Rutherford Backscattering Spectrometry (RBS) analysis. According to this measurement, the atomic ratio was 3.5 [Atomic %] in a case where the second metal layer SB2 of TaN or Ru was not provided in the metal region RB. Regarding this, as shown in FIGS. 3 and 4, the second metal layer SB2 of TaN may be provided on the first metal layer SB1 of TiN in the metal region RB, or the second metal layer SB2 of Ru may be provided in the metal region RB. In any of the two cases, the atomic ratio was 0.0 [Atomic %].

Figure 5A:
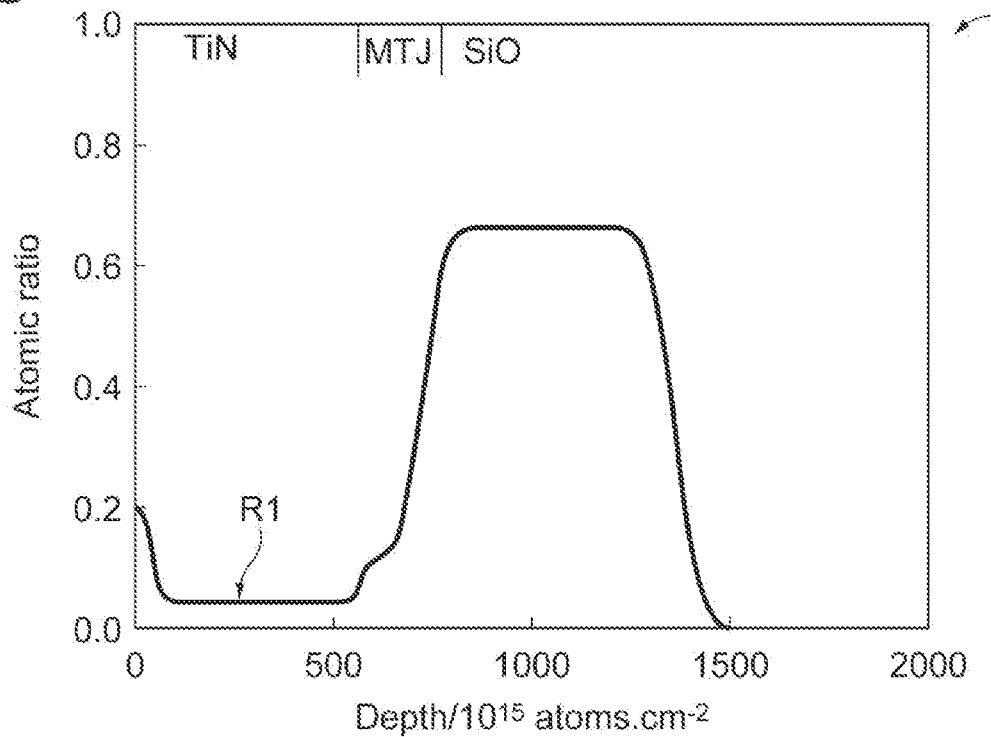
FIGS. 5A and 5B are diagrams for explaining effects of the substrate product manufactured by the substrate manufacturing method shown in FIG. 1.
Figure 5B:
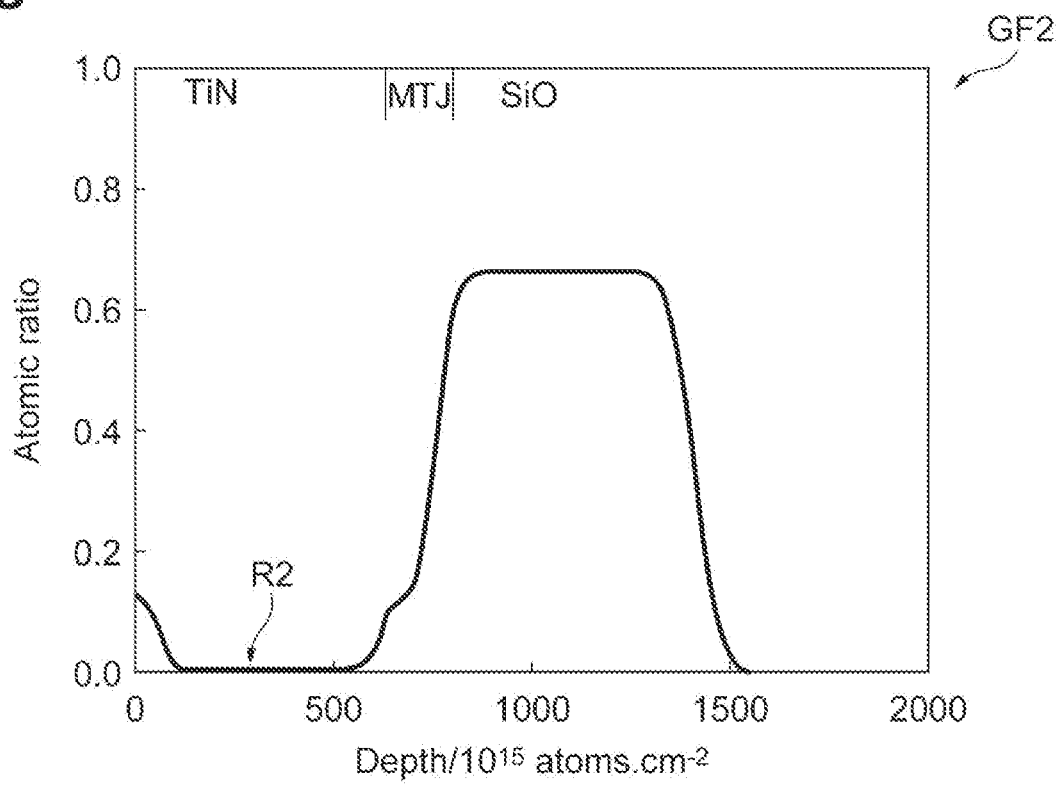

In FIGS. 5A and 5B, results obtained by measuring the atomic ratio of oxygen by RBS analysis are shown in graphs GF1 and GF2. The graph GF1 shows results of the measurement of the atomic ratio of oxygen in the first lamination region RA and the metal region RB in a case where the second metal layer SB2 of TaN or Ru is not provided on the first metal layer SB1 of TiN in the metal region RB. The graph GF2 shows results of the measurement of the atomic ratio of oxygen in the first lamination region RA and the metal region RB in a case where the second metal layer SB2 of TaN or Ru is provided on the first metal layer SB1 of TiN in the metal region RB (in the case shown in FIGS. 3 and 4).

The horizontal axis shown in FIGS. 5A and 5B represents a depth [Depth/$10^{15}$ atoms·cm$^{-2}$] from the surface of the first metal layer SB1 of TiN in both the graphs GF1 and GF2. The vertical axis shown in FIGS. 5A and 5B represents an atomic ratio [Atomic ratio] (1/100 times the above [Atomic %]) in both the graphs GF1 and GF2.

In FIGS. 5A and 5B, the atomic ratio of oxygen in the first metal layer SB1 of TiN is shown as a region R1 in the graph GF1 and as a region R2 in the graph GF2. In a case where the atomic ratio of oxygen shown as the region R1 is compared to the atomic ratio of oxygen shown as the region R2, the atomic ratio of oxygen in the first metal layer SB1 of TiN is lower in the graph GF2 than in the graph GF1. In a case where the second metal layer SB2 of TaN or Ru is provided in the metal region RB as shown in FIGS. 3 and 4, the atomic ratio of oxygen in the first metal layer SB1 of TiN is lower than in a case where the second metal layer SB2 of TaN or Ru is not provided in the metal region RB.

Returning to FIG. 1, the description of the method MT will be continued. In the step ST3 subsequent to the step ST2, the control device Cnt removes the substrate product W1 from the first film forming device 11a and moves the substrate product W1 to the second film forming device 11b. In the step ST3, the control device Cnt prepares the substrate product W1 in the second film forming device 11b. The step ST3 is a step of preparing the substrate product W1 in the second film forming device 11b.

Subsequent to the step ST3, the control device Cnt controls the second film forming device 11b to execute the step ST4. The step ST4 is a step of forming a substrate product W2 having the substrate product W1 using the second film forming device 11b. The substrate product W2 has the substrate product W1 and a second lamination region RC as shown in FIG. 3. The second lamination region RC is provided on the second metal layer SB2 of the substrate product W1. The second lamination region RC has a silicon nitride layer SC1. The silicon nitride layer SC1 is provided on the second metal layer SB2. The silicon nitride layer SC1 is in contact with the second metal layer SB2.

In the step ST4, a photoresist PR defining an etching pattern is formed on the second lamination region RC. The photoresist PR is used for etching to be executed in the step ST6.

The first metal layer SB1 of TiN or Ta and the second metal layer SB2 of TaN or Ru can be framed using the first film forming device 11a. In this case, after the formation, the influence of oxygen on the first metal layer SB1 of TiN or Ta can be avoided by the second metal layer SB2 even in a case where a film is further formed on the second metal layer SB2.

In the step ST5 subsequent to the step ST4, the control device Cnt removes the substrate product W2 from the second film forming device 11b and moves the substrate product W2 to the etching device 12. The control device Cnt prepares the substrate product W2 in the etching device 12 in the step ST5. The step ST5 is a step of preparing the substrate product W2 in the etching device 12.

Subsequent to the step ST5, the control device Cnt controls the etching device 12 to execute the step ST6. The step ST6 is a step of continuously etching the second lamination region RC and the second metal layer SB2 using the etching device 12.

For example, process conditions for continuously etching the second lamination region RC and the second metal layer SB2 in the step ST6 may be as follows. That is, the process conditions may be conditions for generating plasma from a first etching gas by applying a power for ionization of 200 to 1,000 [W] and a power for bias of 30 to 300 [W] under a pressure of 10 to 50 [mT]. The first etching gas may be, for example, a mixed gas containing a $CF_4$ gas (50 to 150 [sccm]), a $CHF_3$ gas (50 to 150 [sccm]), and an $O_2$ gas (5 to 30 [sccm]).

In the step ST6, the first metal layer SB1 of TiN or Ta is etched subsequent to the etching of the second lamination region RC and the second metal layer SB2. For example, process conditions for etching the first metal layer SB1 of TiN or Ta in the step ST6 may be as follows. That is, the process conditions may be conditions for generating plasma from a second etching gas by applying a power for ionization of 200 to 1,000 [W] and a power for bias of 30 to 300 [W] under a pressure of 10 to 50 [mT]. The second etching gas may be, for example, a mixed gas containing a $BCl_3$ gas (30 to 150 [sccm]), a $Cl_2$ gas (30 to 150 [sccm]), a $C_4F_8$ gas (3 to 20 [sccm]), and an Ar gas (50 to 300 [sccm]).

In the step ST6, the second lamination region RC and the second metal layer SB2 can be continuously etched. Accordingly, the etching of the second lamination region RC and the second metal layer SB2 can be relatively easily performed.

In one exemplary embodiment, the configurations of the substrate products W1 to W3 shown in FIG. 3 can be used for, for example, the manufacturing of magnetoresistive random access memory (MRAM). The first lamination region RA has, for example, a magnetic tunnel junction (MTJ: magnetoresistive tunnel junction) region. In this case, the control device Cnt controls the first film forming device 11a to form the first lamination region RA having the MTJ region on the support base SW. The metal region RB can be used as an electrode of the MRAM.

FIG. 4 illustrates a configuration of the substrate product W2 in a case where the first lamination region RA has the MTJ region. The first lamination region RA has layers LY1 to LY15. The metal region RB has layers LY16 and LY17. The second lamination region RC has layers LY18 to LY21.

In the first lamination region RA, the layers LY1 to LY15 are laminated in order on the support base SW. In the metal region RB, the layers LY16 and LY17 are laminated in order on the first lamination region RA (on the layer LY15). In the second lamination region RC, the layers LY18 to LY21 are laminated in order on the metal region RB (on the layer LY17).

The layers LY1 to LY15 correspond to the MTJ region. The layer LY16 is an example of the first metal layer SB1 shown in FIG. 3. The layer LY17 is an example of the second metal layer SB2 shown in FIG. 3. The layer LY18 is an example of the silicon nitride layer SC1 shown in FIG. 3.

The support base SW may be a Si (silicon) substrate having a $SiO_2$ (silicon dioxide) layer on a surface thereof. The layer LY1 has Ta (tantalum). The layer LY2 has Ru (ruthenium). The layer LY3 has Ta. The layer LY4 is a base layer having Pt (platinum). The layer LY5 is a magnetic layer having Pt/Co (Co: cobalt). The layer LY6 has Co. The layer LY7 has Ru. The layer LY8 is a magnetic layer having Pt/Co. The layer LY9 has Co. The layer LY10 has Ta. The layer LY11 has CoFeB (Fe: iron, B: boron). The layer LY12 has MgO (magnesium oxide). The layer LY13 has CoFeB. The layer LY14 has Ta. The layer LY15 has Ru.

The layer LY16 (first metal layer SB1) has TiN (titanium nitride). The layer LY17 (second metal layer SB2) has TaN (tantalum nitride).

The layer LY18 (silicon nitride layer SC1) has SiN (silicon nitride). The layer LY19 has $SiO_2$. The layer LY20 has SiC (silicon carbide). The layer LY21 is a SOG (spin on glass) layer.

Although various exemplary embodiments have been described above, various modified aspect may be configured without being limited to the above-described exemplary embodiments.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate manufacturing method using plasma, comprising:
    preparing a support base in a first film forming device; and
    forming a first substrate product having the support base using the first film forming device,
    wherein the first film forming device is configured to form a film using plasma in a consistent vacuum state without exposure to an atmosphere,
    in the forming of the first substrate product, the first substrate product is formed in a consistent vacuum state,
    the first substrate product has the support base, a first lamination region, and a metal region,
    the first lamination region is provided on the support base,
    the metal region is provided on the first lamination region, and has a first metal layer and a second metal layer,
    the first metal layer is provided on the first lamination region,
    the second metal layer is provided on the first metal layer,
    a material of the first metal layer has TiN or Ta, and
    a material of the second metal layer has TaN or Ru.

2. The substrate manufacturing method according to claim 1, further comprising:
    preparing the first substrate product in a second film forming device; and
    forming a second substrate product having the first substrate product using the second film forming device,
    wherein the second film forming device is configured to form a film using plasma,
    the second substrate product has the first substrate product and a second lamination region,
    the second lamination region is provided on the second metal layer of the first substrate product, and has a silicon nitride layer, and
    the silicon nitride layer is provided on the second metal layer.

3. The substrate manufacturing method according to claim 2, further comprising:
    preparing the second substrate product in an etching device; and
    continuously etching the second lamination region and the second metal layer using the etching device,
    wherein the etching device is configured to perform etching using plasma.

4. The substrate manufacturing method according to claim 1,
    wherein the first lamination region has a magnetic tunnel junction region.

* * * * *